(12) United States Patent
May et al.

(10) Patent No.: US 11,107,780 B2
(45) Date of Patent: Aug. 31, 2021

(54) PSEUDO-STRIPLINE USING DOUBLE SOLDER-RESIST STRUCTURE

(71) Applicant: Intel Corporation, Santa Clara, CA (US)

(72) Inventors: Lilia May, Chandler, AZ (US); Robert Alan May, Chandler, AZ (US); Amruthavalli Pallavi Alur, Tempe, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 33 days.

(21) Appl. No.: 16/435,136

(22) Filed: Jun. 7, 2019

(65) Prior Publication Data

US 2020/0388582 A1 Dec. 10, 2020

(51) Int. Cl.
*H01L 23/66* (2006.01)
*H05K 1/02* (2006.01)
*H01L 23/00* (2006.01)
*H01L 23/522* (2006.01)

(52) U.S. Cl.
CPC .......... *H01L 23/66* (2013.01); *H01L 23/5226* (2013.01); *H01L 24/09* (2013.01); *H01L 24/17* (2013.01); *H05K 1/0243* (2013.01); *H01L 2223/6627* (2013.01)

(58) Field of Classification Search
CPC ..... H01L 23/66; H01L 23/5226; H01L 24/17; H01L 24/09; H05K 1/0243
See application file for complete search history.

(56) References Cited

U.S. PATENT DOCUMENTS

2018/0174972 A1 6/2018 Weng et al.
2019/0318990 A1* 10/2019 Nakagawa ........ H01L 23/49838

* cited by examiner

*Primary Examiner* — Quoc D Hoang
(74) *Attorney, Agent, or Firm* — Schwegman Lundberg & Woessner, P.A.

(57) ABSTRACT

An integrated-circuit package substrate includes a pseudo-stripline that is shielded below a lower solder-resist layer and an upper solder-resist layer, where an upper shielding plane is sandwiched between the lower and upper solder-resist layers. The lower solder-resist layer can at least partially overlap a landing-pad region of a landing-pad via that penetrates a top build-up layer which is contacted by the lower solder-resist layer.

16 Claims, 9 Drawing Sheets

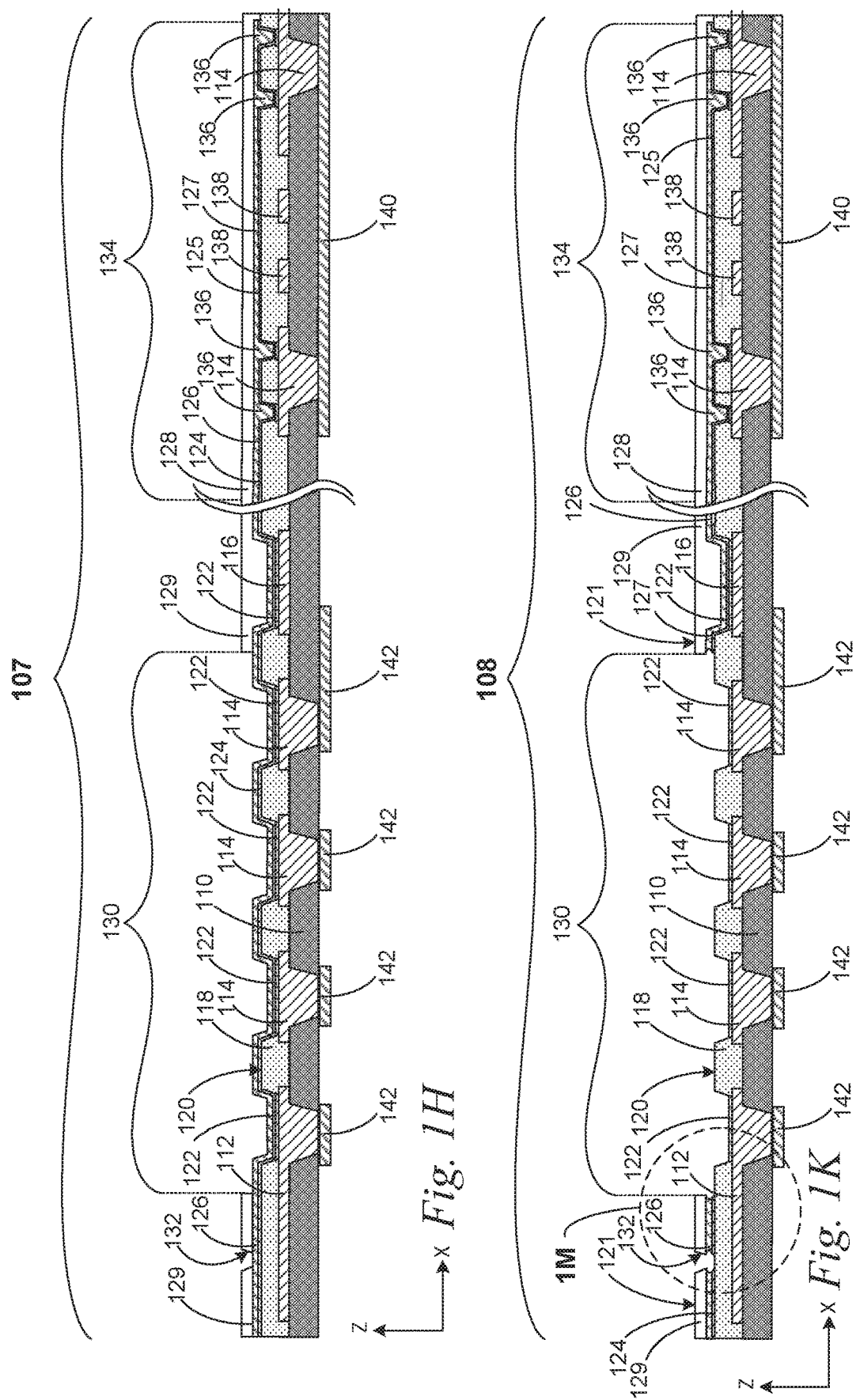

PSEUDO-STRIPLINE USING DOUBLE SOLDER-RESIST STRUCTURE

FIELD

This disclosure relates to integrated-circuit device package substrates that minimize layers while providing useful signal integrity in stripline structures.

BACKGROUND

Integrated circuit miniaturization during interconnecting, experiences package real estate budget issues where both mounted dice and signal integrity take up useful space.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1H is a cross-section elevation of the integrated-circuit package substrate depicted in FIG. 1F, with extended structure depicted according to an embodiment;

FIG. 1K is a cross-section elevation of the integrated-circuit package substrate depicted in FIG. 1H after further processing according to an embodiment. Items 1I and 1J are omitted;

DETAILED DESCRIPTION

A photoactive upper solder-resist layer simultaneously encapsulates, and is used to form a patterned ground plane. The patterned ground plane in turn is formed on a photoactive lower solder-resist layer. The lower solder-resist layer is formed upon a die side of an integrated-circuit package substrate at a top build-up layer.

In a die region of the integrated-circuit package substrate, the upper solder-resist layer is patterned to open a seat for a flip-chip mounted device such as a processor die integrated-circuit device. In a passive surface-mount region of the integrated-circuit package substrate, the upper solder-resist layer is patterned to open a seat for a passive device such as an inductor or a capacitor.

In a stripline region of the integrated-circuit package substrate, the upper solder-resist layer is principally not patterned, to cover the patterned ground plane that has been formed on the lower solder-resist layer. Incidental ground vias penetrate the lower solder-resist layer to allow grounding contact from the patterned ground plane to an in-package-substrate ground plane. Other incidental depressions in the upper solder-resist layer are used as adhesion holes. Consequently, stripline traces that are on the die side of the integrated-circuit package substrate, have shielding from both the in-package-substrate ground plane and from the patterned ground plane that is between the upper and lower solder-resist layers.

Figure 1A:
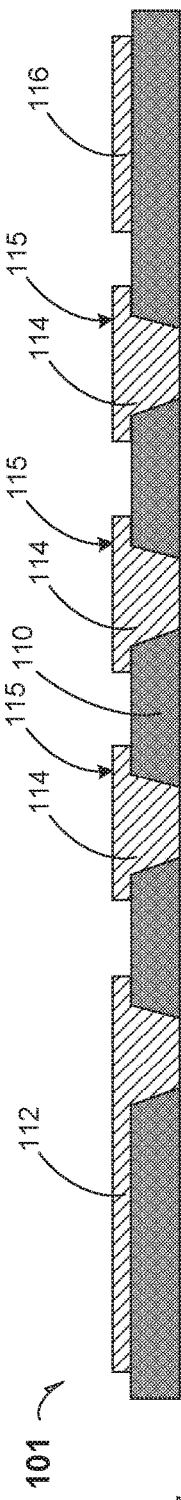
FIG. 1A is a cross-section elevation of a portion of an integrated-circuit package substrate during processing of a pseudo-stripline and other structures according to an embodiment.

FIG. 1A is a cross-section elevation of a portion of an integrated-circuit package substrate 101 during processing of a pseudo-stripline and other structures according to an embodiment. A top build-up layer 110 of an integrated-circuit package substrate has been processed with signal vias, traces and ground contacts and planes. In an embodiment, a Evia with an integral surface trace 112 communicates through the top build-up layer 110. In an embodiment, vias 114 (three occurrences) include landing-pad surfaces 115 for connecting electrical contacts such as solder bumps. In an embodiment, a surface plane 116 is formed on the top build-up layer 110, which will also be part of the pseudo-stripline structure as a shielding ground plane 116.

Figure 1B:
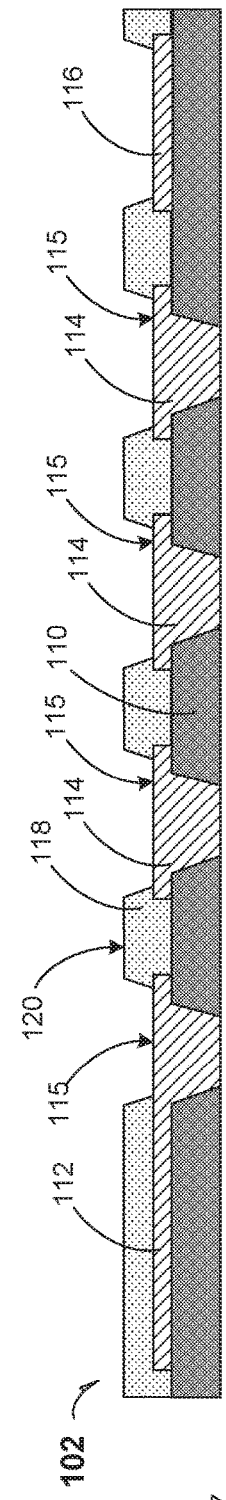
FIG. 1B is a cross-section elevation of the integrated-circuit package substrate depicted in FIG. 1A after further processing according to an embodiment.

FIG. 1B is a cross-section elevation of the integrated-circuit package substrate 101 depicted in FIG. 1A after further processing according to an embodiment. A lower solder-resist layer 118 is formed and patterned over the several structures 112, 114 and 116, with patterning resulting in a die side 120 of the integrated-circuit package substrate 102. An integral-trace via 112 includes both substantial structure above the top build-up layer 110, and a via portion that penetrates the top build-up layer 110. A landing-pad via 114 includes both incidental structure above the top build-up layer 110, and a via portion that penetrates the top build-up layer 110. A surface plane 116 is substantially entirely on the upper surface of the top build-up layer 110.

In an embodiment, the die side 120 is a conventional top surface of an integrated-circuit package substrate, as a single solder-resist 118 on the top build-up layer 110. As depicted, the surface plane 116 has been patterned similar to that of the landing-pad vias 114, as the surface plane 116 is proximate and adjacent a device footprint that is being formed.

Characteristic of the solder resist 118 is that it both contacts the top build-up layer 110 and it partially overlaps the landing-pad surfaces 115 of the vias 114. Where the via with an integral trace 112 is also to be used for electrical-bump contact, it also has a landing-pad surface 115 that is partially overlapped by the solder resist 118.

Figure 1C:
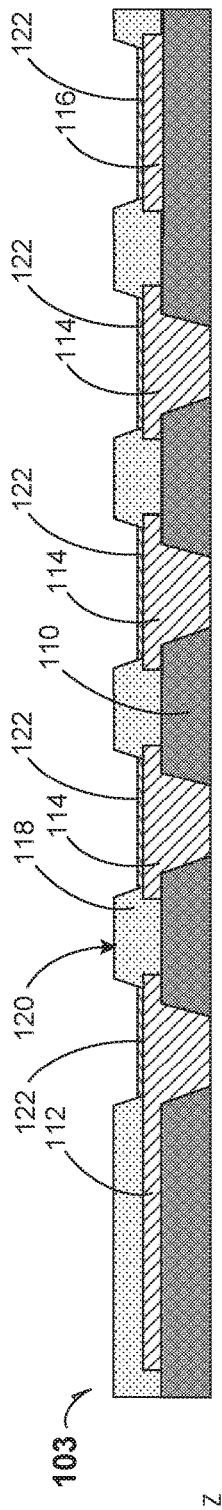
FIG. 1C is a cross-section elevation of the integrated-circuit package substrate depicted in FIG. 1B after further processing according to an embodiment.

FIG. 1C is a cross-section elevation of the integrated-circuit package substrate 102 depicted in FIG. 1B after further processing according to an embodiment. The integrated-circuit package substrate 103 has been processed by forming a surface finish 122 upon metallic structures exposed through the lower solder-resist layer 118. The surface finish 122 as depicted, is formed on the surface trace 112, the landing-pad vias 114 and the shielding ground plane 116. In an embodiment, the surface finish 122 is precious metal such as gold (Au). In an embodiment, the surface finish 122 is precious-metal alloy such as a nickel-palladium-gold (NiPdAu). In an embodiment, the surface finish 122 is formed by electroless plating, where the exposed structures 112, 114 and 116 are sufficiently metallic to favor electroless plating, but not upon the lower solder-resist layer 118. The surface finish 122 is useful in subsequent processing, as an etch stop where copper may be etched and the etch recipe is selective to leaving the surface finish 122.

Figure 1D:
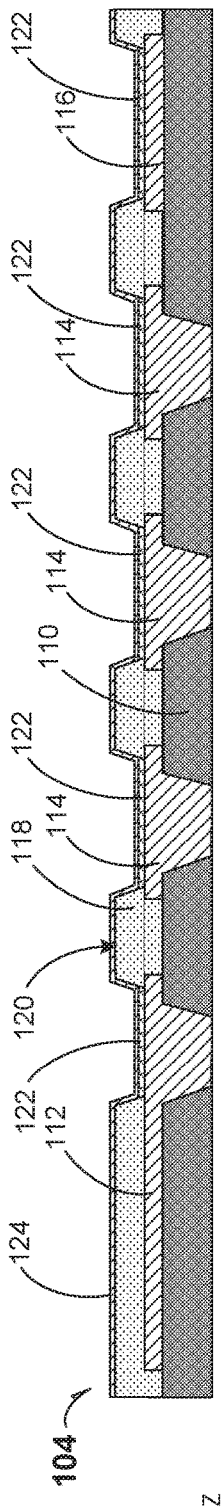
FIG. 1D is a cross-section elevation of the integrated-circuit package substrate depicted in FIG. 1C after further processing according to an embodiment.
Figure 1E:
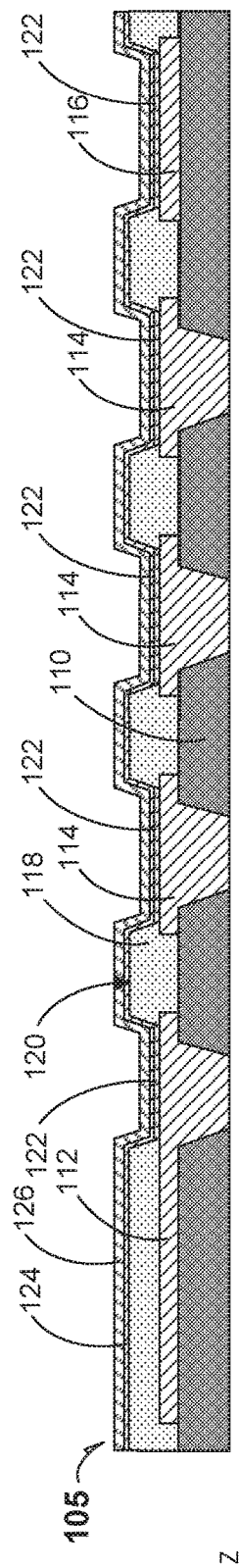
FIG. 1E is a cross-section elevation of the integrated-circuit package substrate depicted in FIG. 1D after further processing according to an embodiment.

FIG. 1D is a cross-section elevation of the integrated-circuit package substrate 103 depicted in FIG. 1C after further processing according to an embodiment. The integrated-circuit package substrate 104 has been processed by plating a conformal metallization film 124 over the entire structure, including the surface finish 122 and the lower solder-resist layer 118. In an embodiment, the conformal metallization film 124 is formed by electroless plating. In an embodiment, the conformal metallization film 124 is formed by physical vapor deposition (PVD) such as sputtering copper. In an embodiment, the conformal metallization film 124 is formed by chemical vapor deposition (CVD) such as by decomposing an organic copper compound, FIG. 1E is a cross-section elevation of the integrated-circuit package substrate 104 depicted in FIG. 1D after further processing according to an embodiment. The integrated-circuit package substrate 105 is alternatively panel-plated where the conformal metallization film 124 depicted in FIG. 1D is reinforced and made thicker with a plated metallization layer 126 such as by electroplating that uses the conformal metallization film 124 is used as a cathode. In an embodiment where a useful thicker film 126 is plated, a pseudo-stripline embodiment has greater EMI shielding by presence of the plated metallization layer 126, In an embodiment, the plated metal film 126 is an electronics-grade copper material.

Figure 1F:
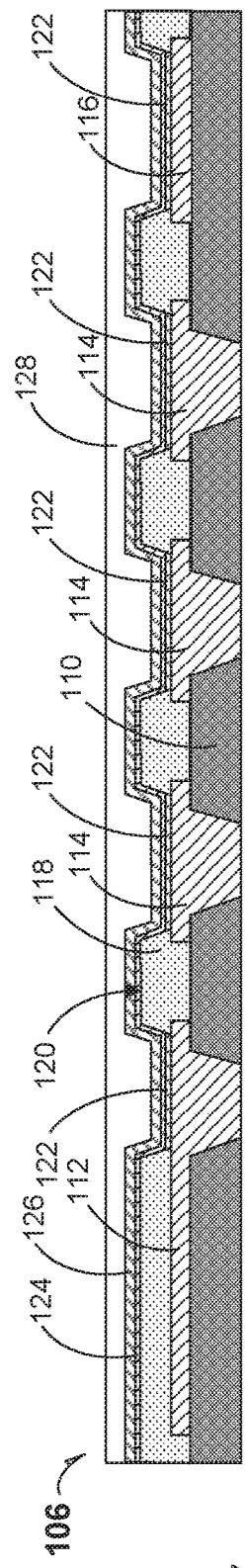
FIG. 1F is a cross-section elevation of the integrated-circuit package substrate depicted in FIG. 1D after further processing according to an embodiment.

FIG. 1F is a cross-section elevation of the integrated-circuit package substrate 105 depicted in FIG. 1D after further processing according to an embodiment. The integrated-circuit package substrate 106 is processed by roughening the plated metallization layer 126 (or the conformal metallization film 124 where the plated metallization layer 126 is not used), followed by forming an upper solder-resist precursor 128. Roughening processes improve adhesion of an upper solder-resist precursor 128 to the metallization it contacts. In an embodiment, the upper solder-resist precursor 128 is an organic material that is spun on, optically cured and patterned.

Figure 1G:
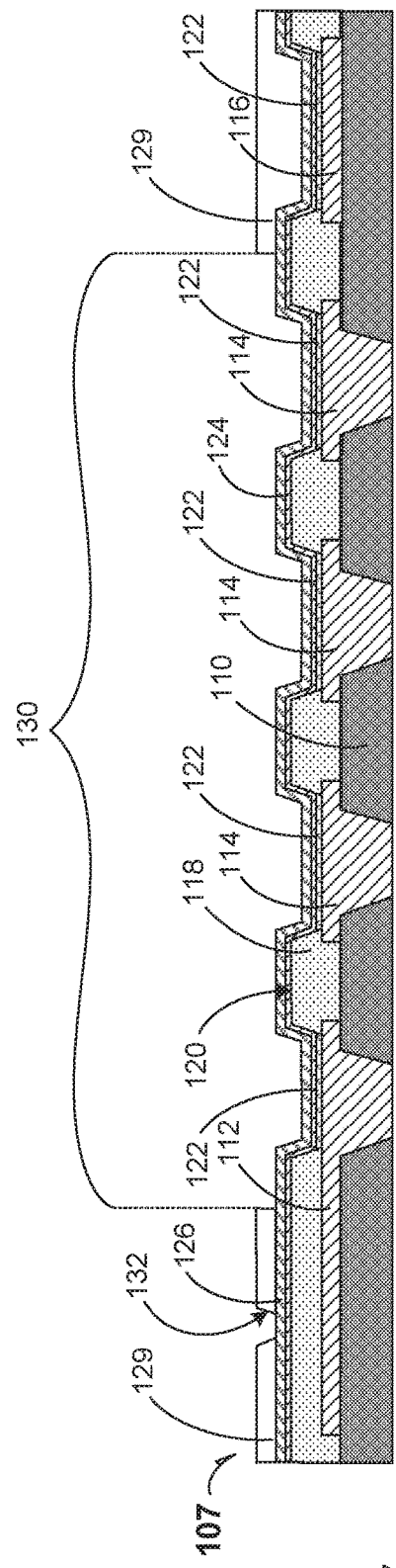
FIG. 1G is a cross-section elevation of the integrated-circuit package substrate depicted in FIG. 1E after further processing according to an embodiment.

FIG. 1G is a cross-section elevation of the integrated-circuit package substrate 106 depicted in FIG. 1E after further processing according to an embodiment. The integrated-circuit package substrate 107 is processed by patterning the upper solder-resist precursor 128 (FIG. 1F) to form a patterned upper solder resist layer 129. The patterned upper solder resist layer 129 creates a seat region 130 for a device such as a flip-chip die semiconductor processor. Patterning also is done to create useful adhesion holes, one incidence of which is indicted with reference number 132. As depicted, the adhesion hole 132 is formed to open the upper solder-resist layer 129.

FIG. 1H is a cross-section elevation of the integrated-circuit package substrate 107 depicted in FIG. 1F, with extended structure depicted according to an embodiment. The seat region 130 is depicted near a stripline region 134, and the patterned portion 129 of upper solder-resist layer within the seat region 130 is near an unpatterned portion 128 within the stripline region 134.

Within the stripline region 134, the conformal metallization film 124 and the plated metallization layer 126 form solid vias 136 that contact bond pads 114 within the stripline region 134 according to an embodiment. Stripline traces 138 are also formed on the top build-up layer 110, as part of formation of the several trace, bond pad vias and plane structures 112, 114 and 116. Structures within the integrated-circuit package substrate 107 that are below and contacting the several bond pads 114, include a lower stripline shielding plane 140 within the stripline region 134, and interconnect traces 142 within the seat region 130.

As depicted, the shielded stripline traces 138 have an X-Y form factor where the trace 138 runs orthogonal to the X-Z view in the drawing. Consequently the lower stripline shielding plane 140, and the shielding planes 125 and 127, if present, shield the X-Y form factor of the shielded stripline traces 138. Whether both upper shielding planes 125 and 127 are present, or only the conformal metallization-film shielding plane 125, the upper shielding plane structures are sandwiched between the lower solder-resist layer 118 and the upper solder-resist layer 128.

FIG. 1K is a cross-section elevation of the integrated-circuit package substrate 107 depicted in FIG. 1H after further processing according to an embodiment. Items 1I and 1J are omitted. The integrated-circuit package substrate 108 has been processed to etch the conformal metallization film 124 and the plated metallization layer 126, if present, within the seat region 130. In an embodiment, an etch is completed that is selective to leaving the surface finish 122 as an etch-stop layer 122, and the surface finish 122 is ready to receive electrical bumps such as from a flip-chip mounted semicondutive device such as a processor die.

Patterning the upper solder-resist: layer 129 above the lower solder-resist layer 118, opens the die-seat region 130 and the unpatterned upper solder-resist layer 128 remains over the stripline trace 138. The unpatterned upper solder-resist layer 128 also covers a stripline-shielding portion 127 of the plated metallization 126, if present. Further, the unpatterned upper solder-resist layer 128 remains over a shielding portion 125 of the conformal metallization film 124. In any event the unpatterned solder-resist layer 128 resists oxidation and other ambient-exposure effects that result in discoloration of the respective conformal and plated shielding metallizations 125 and 127.

A pseudo-stripline structure is completed that includes the stripline traces 138, between the stripline shielding plane 140 and stripline-shielding portion 127 of the plated metallization layer 126. In an embodiment where no plated metallization layer 126 is present, a stripline-shielding portion 125 of the conformal metallization film 124, is part of the pseudo-stripline structure that includes the stripline shielding plane 140 and the stripline traces 138.

Adjacent the seat region 130, which may also be referred to as a bump-receiving field 130, the stripline-shielding portion 127 of the plated metallization layer 126, acts as a ground plane 127 that is brought close to the bump-receiving field 130. In an embodiment, the lateral distance between a landing-pad via 114 that is on the edge of the bump-receiving field 130, and the edge of the stripline-shielding portion 127 of the plated metallization layer 126, is in a range from 5 micrometer (μm) to 15 μm. In an embodiment, the lateral distance between a landing-pad via 114 that is on the edge of the bump-receiving field 130, and the edge of the stripline-shielding portion 127 of the plated metallization layer 126, is 10 μm. Consequently, a grounding plane 127 is brought into a range of less than 20 μm lateral distance to the bump-receiving field 130. The grounding plane 127 also acts as the upper shielding layer 127 for a pseudo-stripline trace 138 with the lower stripline shielding plane 140 completing upper and lower shielding.

After processing represented in FIG. 1K, the surface finish 122 abuts and terminates at the lower solder-resist layer 118, and the lower solder-resist layer 118 at least partially overlaps the landing-pad vias 112 and 114 at landing-pad surfaces 115 (see FIG. 1B).

Figure 1M:
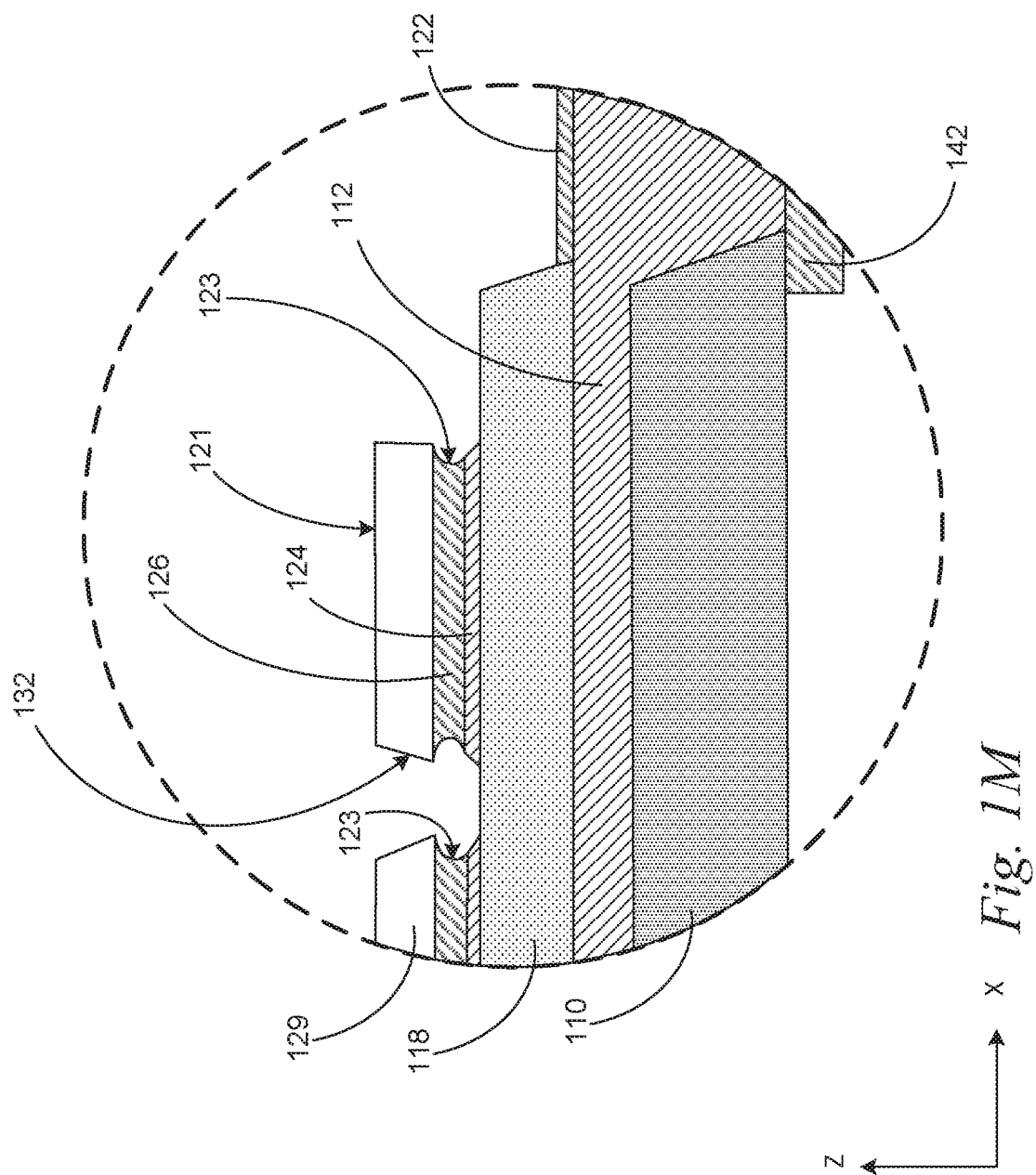
FIG. 1M is a cross-section elevation and detail section of the integrated-circuit package substrate depicted in FIG. 1K according to an embodiment. Item IL is omitted.

FIG. 1M is a cross-section elevation and detail section 1M of the integrated-circuit package substrate 108 depicted in FIG. 1K according to an embodiment. Item 1L, is omitted. Etch processing that has removed the conformal metallization film 124 and the plated metallization layer 126, through the patterned upper photo-resist layer 129, results in undercuts 123 in the metallization layers 124, 126 below the patterned upper photo-resist layer 129. In an embodiment, the undercuts 123 are the result of a wet blanket etch, where the surface finish 122 is substantially not etched. The undercuts 123 are seen both within the adhesion hole 132 and at the edge of the bump-receiving field 130 (see FIG. 1K). As depicted when the plated metallization layer 126 is present, the undercut 123 makes a concave vertical profile with the conformal metallization film 124 and the plated metallization layer 126. In an embodiment where no plated metallization layer 126 is present, the undercut 123 is created only by a concave vertical profile of the conformal metallization film 124.

Figure 2:
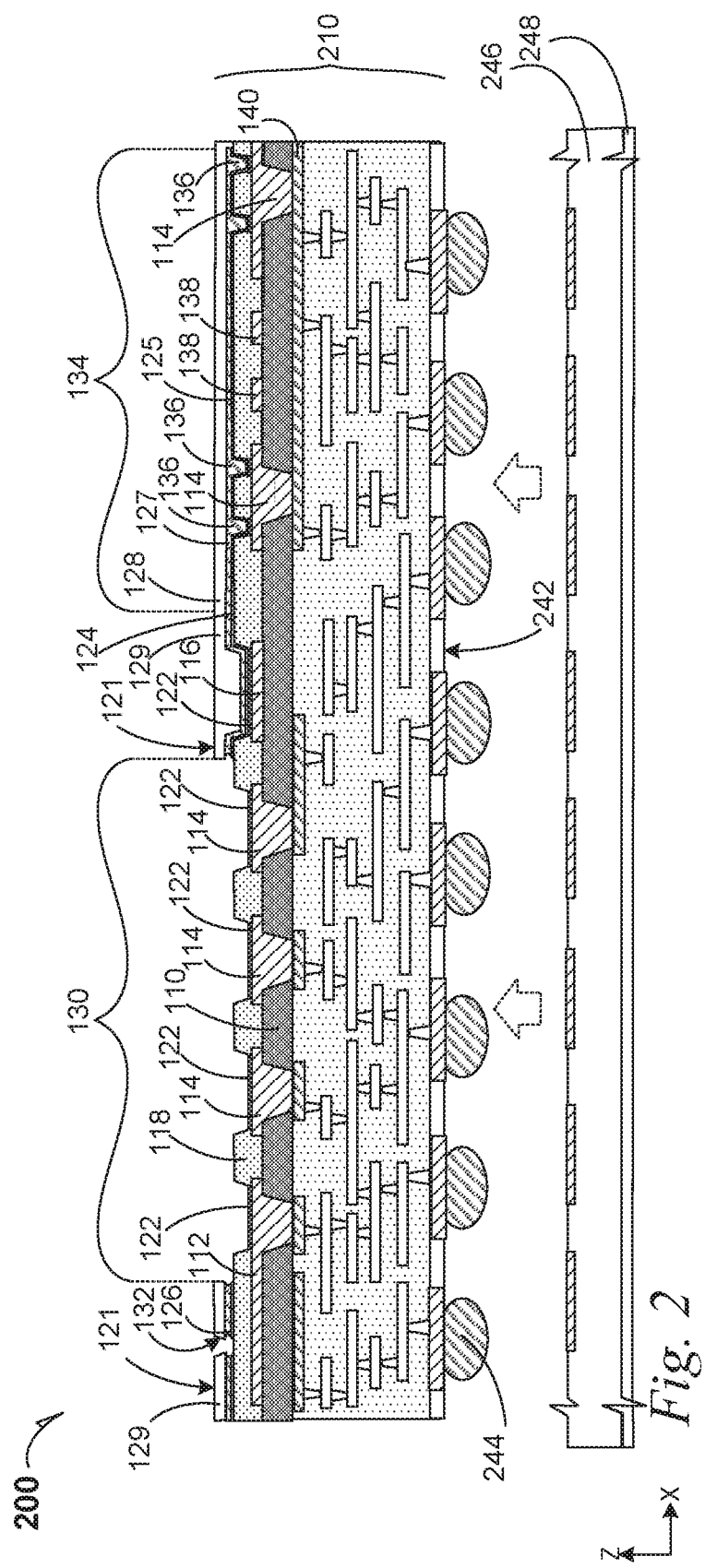
FIG. 2 is a cross-section elevation of an integrated-circuit package substrate according an embodiment.

FIG. 2 is a cross-section elevation 200 of an integrated-circuit package substrate 210 according an embodiment. Details of the integrated-circuit package substrate 108 depicted in FIG. 1K are seen between a die side 121 that is the upper surface 121 of the upper solder-resist layer 128, 129, and a land side 242 that is essentially the bottom of the integrated-circuit package substrate 210. The integrated-circuit package 210 is depicted in truncated form to illustrate a seat region 130 and a stripline region 134. Other structures including repeated seat and stripline regions may be incorporated into the integrated-circuit package substrate 210, among other functional structures.

In an embodiment, after forming electrical bumps 244 on the land side 242, the integrated-circuit package substrate 210 is seated on a board 246 such as a printed-wiring-board motherboard 246. In an embodiment, the board 246 includes an external shell 248 that provides both physical and electrical insulation for devices within the external shell 248. In an embodiment, the board 246 holds a chipset (see FIG. 3 and FIG. 6).

Figure 3:
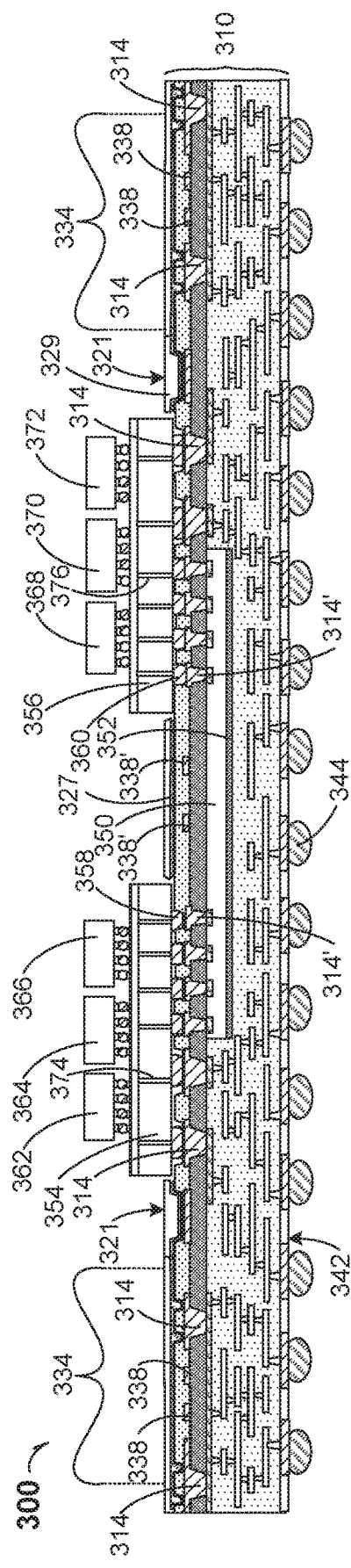
FIG. 3 is a cross-section elevation of an integrated-circuit apparatus that includes at least one pseudo-stripline region in an integrated-circuit package substrate according to several embodiments.

FIG. 3 is a cross-section elevation of an integrated-circuit apparatus 300 that includes at least one pseudo-stripline region in an integrated-circuit package substrate 310 according to several embodiments.

The integrated-circuit package substrate 310, along with lower and upper solder-resist layers 318 and 328, form an upper surface 321 of the integrated-circuit package substrate 310 that carries the pseudo stripline embodiments including shielded stripline traces 338 in stripline regions 334.

In an embodiment, the pseudo-stripline-containing integrated-circuit package substrate 310 includes an embedded mulit-die interconnect bridge (EMIB) 350 that is embedded below the lower and upper solder-resist layers 318 and 328. The EMIB 350 is attached to the integrated-circuit package substrate 310 with the die-attach film 352.

In an embodiment, the EMIB 350 is configured to connect with a first integrated circuit chip 354 and a subsequent integrated circuit chip 356. Bridge bond pads 358 and 360 couple to the EMIB 350, through the bridge 314' (two reference lines).

In an embodiment, no EMIB 350 is present, and the bond pads 358 contact the first integrated-circuit die 354, at a level that is below the upper surface 321 of the patterned section of the upper photo-resist layer 329. The bond pads 358 are coupled to the backside of the first integrated-circuit die 354, but in an embodiment with no bridge die 350 is present, the first integrated-circuit die 354 can be seated on the bond pads 358 with the bump-contacting surface below the upper surface of the patterned section of the upper photo-resist layer 329.

Each of the respective first and subsequent integrated circuit chips 354 and 356, is also coupled to the integrated-circuit package substrate 310 in selected substrate vias 314, that communicate to the land side 342.

In an embodiment, the integrated-circuit device package 310 is a base structure for a disaggregated-die computing system 300 that includes chiplets, e.g. 362, 364 and 366 coupled to the first integrated-circuit die 354, one chiplet 362 of which is illustrated coupled to the first integrated-circuit die 354 by a through-silicon via (TSV) 374.

Similarly in an embodiment, the integrated-circuit device package 310 is a base structure for a disaggregated-die computing system 300 that includes chiplets 368, 370 and 372 coupled to the subsequent integrated-circuit die 356, one chiplet 370 of which is illustrated coupled to the subsequent integrated-circuit die 356 at a TSV 376.

In an embodiment, bridge-traversing striplines 338' are located above the bridge die 350, and the bridge-traversing striplines 338' are used to connect two devices (not pictured) that may be configured in a communication direction that is orthogonal to the communication direction allowed by the bridge die 350, between the first integrated-circuit die 354 and the subsequent integrated-circuit die 356. Shielding of the bridge-traversing striplines 338', is one-sided 327, as the EMIB 350 is below the bridge-traversing striplines 338'.

Figure 4:
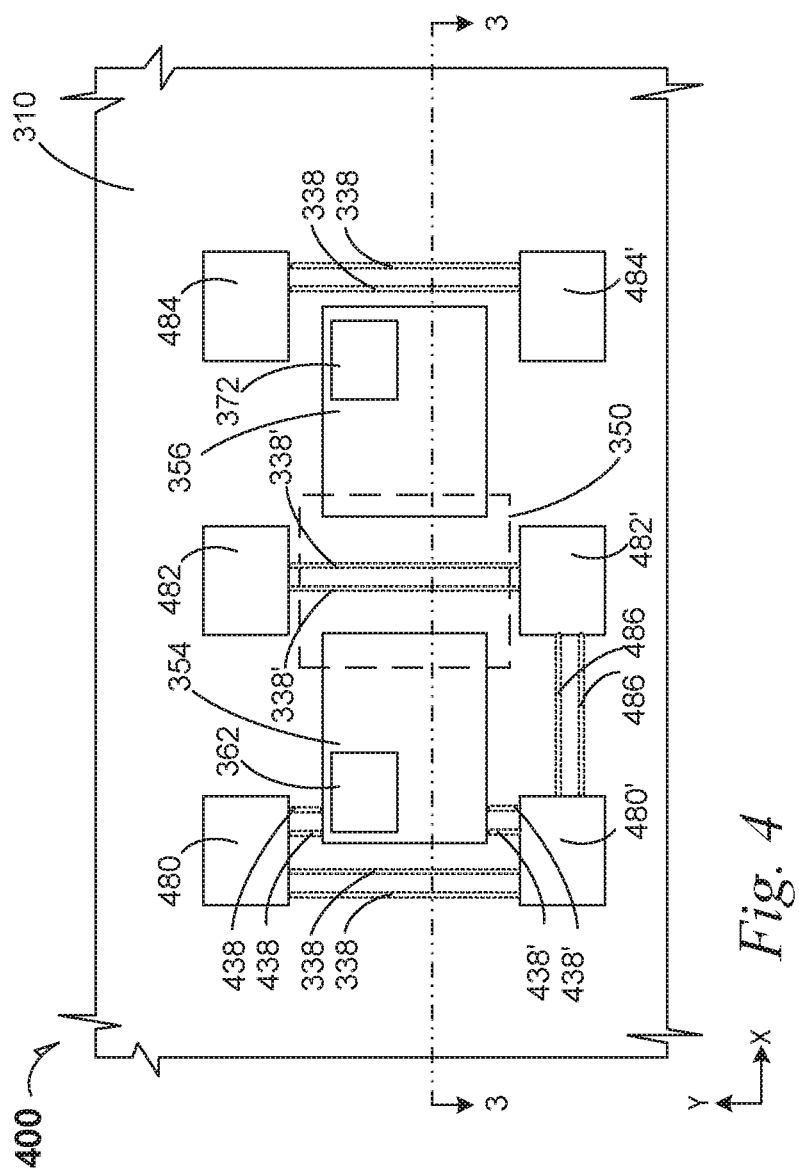
FIG. 4 is a top plan of an integrated-circuit apparatus that includes selected structure depicted in FIG. 3 according to several embodiments.

FIG. 4 is a top plan 400 of an integrated-circuit apparatus 400 that includes selected structure depicted in FIG. 3 according to several embodiments. The cross-section view of FIG. 3 is taken along the section line 3 - - 3, where the such as the shielded stripline traces 338 are embedded in the integrated-circuit package substrate 310, and the bridge-traversing striplines 338', if present, connect two integrated circuits 482 and 482', orthogonal to the bridge connection between the first integrated-circuit device 354 and the subsequent integrated-circuit device 356.

In an embodiment, the shielded stripline traces 338 are configured to pass a "noisy" integrated-circuit device 354 without connection between two devices 480 and 480' to the integrated-circuit device 354. In an embodiment, shielded stripline traces 438 are configured to connect an integrated-circuit device 480 to the integrated-circuit device 354.

In an embodiment, the integrated-circuit devices 354, 480 and 480' are coupled with the several shielded-stripline traces 338, 338' and 438 to a chipset that includes the first integrated-circuit device 354, the subsequent integrated-circuit device 356 and with chiplets 480, 480', 482, 482', 484 and 484', or a subset of fewer than the enumerated chiplets.

In an embodiment, the first integrated-circuit die 354 is coupled in a chipset with the chiplets 480, 480' and 482, and shielded-stripline embodiments 338 and 486 allow the chiplet 480' to act as a pseudo-bridge die 480' between the chiplet 480 and the chiplet 482'. Similarly with the die 354 and the chiplets 480, 480' and 482', the shielded striplines 438 and 438', allow the integrated-circuit die 354 to act as a pseudo-bride die 354 between the chiplets 480 and 480'.

Figure 5:
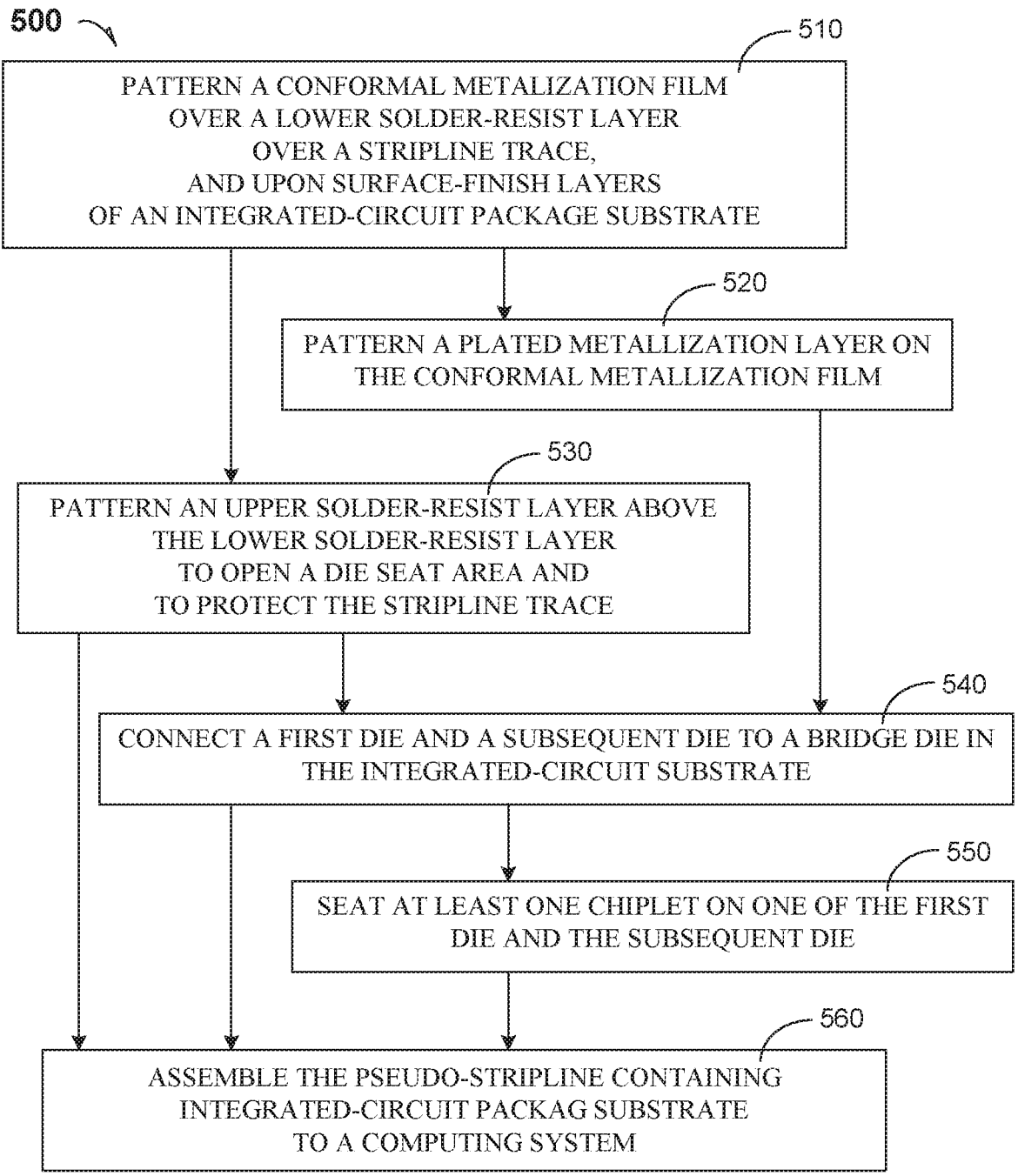
FIG. 5 is a process flow diagram according to several embodiments.

FIG. 5 is a process flow diagram according to several embodiments.

At 510, the process includes patterning a conformal metallization layer over a lower solder-resist layer, over a stripline trace, and upon surface-finish layers of an integrated-circuit package substrate. In an embodiment, the lower solder-resist layer at least partially overlaps landing-pad surfaces of landing-pad vias, and the conformal metallization film covers both the lower solder-resist layer and the landing-pad surfaces. In a non-limiting example embodiment, only the stripline trace is overpatterned with the conformal metallization film.

At 520, the process optionally includes patterning a plated metallization layer on the conformal metallization film.

At 530, the process includes patterning an upper solder resist layer above the lower solder-resist layer to open a die seat area and to protect the stripline trace. In an embodiment, only the stripline trace is over patterned by the upper solder-resist layer. Where the plated metallization layer 126 is present, the upper solder-resist layer 128 protects the plated metallization layer 126 from oxidation and discoloring due to oxidation and other external effects.

At 540, the process includes connecting a first integrated-circuit chip, and a subsequent integrated-circuit chip to a bridge die (EMIB), only through the upper and lower solder-resist layers. In a non-limiting example embodiment, the die seat area, e.g. 330, is opened sufficiently that all of the upper solder-resist layer is removed.

At 550, the process includes assembling the pseudo-stripline containing integrated-circuit package substrate to a computing system.

Figure 6:
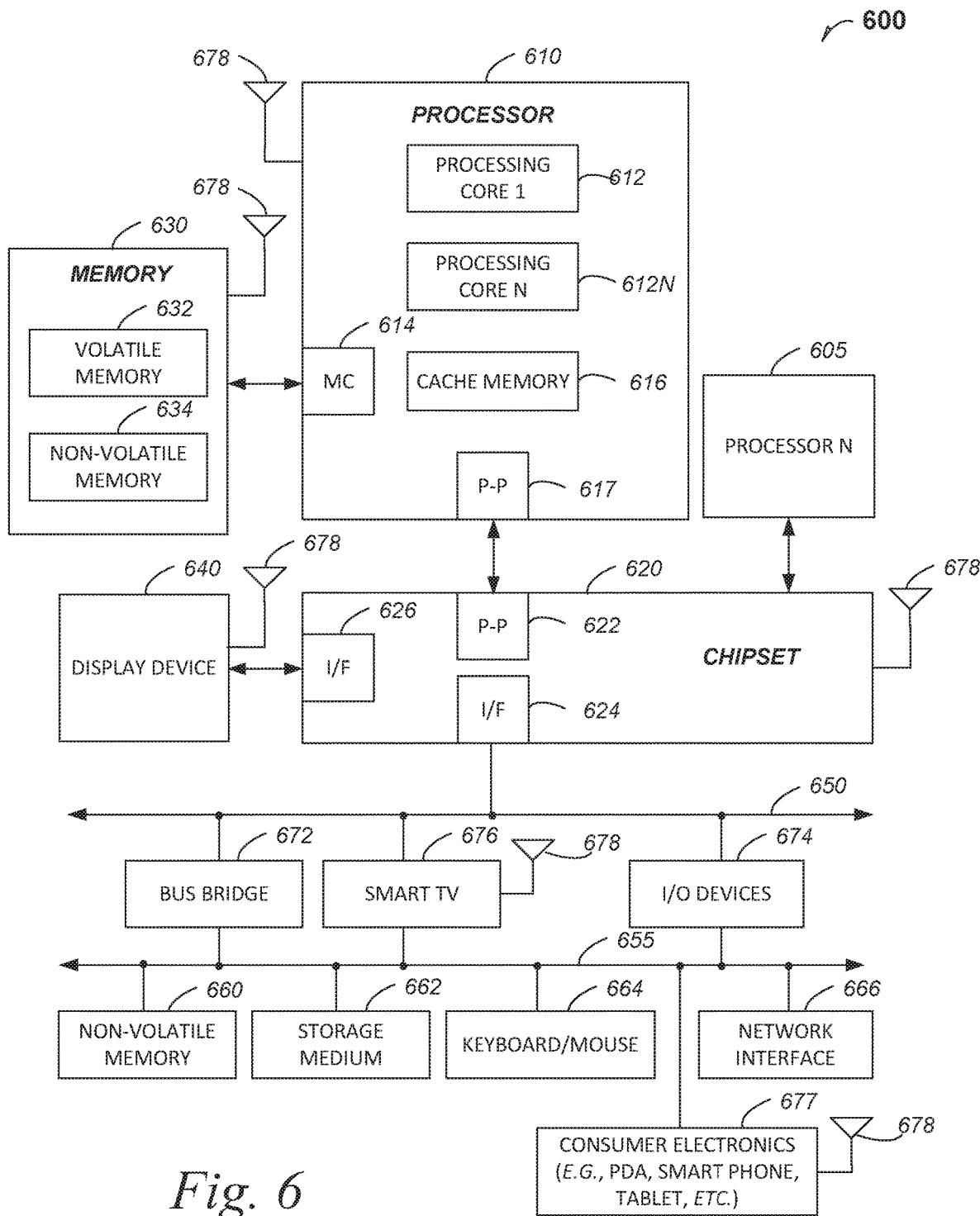
FIG. 6 is included to show an example of a higher-level device application for the disclosed embodiments.

FIG. 6 is included to show an example of a higher-level device application for the disclosed embodiments. The pseudo-stripline in an integrated-circuit package substrate embodiments may be found in several parts of a computing system. In an embodiment, the pseudo-stripline embodiment is part of a communications apparatus such as is affixed to a cellular communications tower. In an embodiment, a computing system 600 includes, but is not limited to, a desktop computer. In an embodiment, a system 600 includes, but is not limited to a laptop computer. In an embodiment, a system 600 includes, but is not limited to a netbook. In an embodiment, a system 600 includes, but is not limited to a tablet. In an embodiment, a system 600 includes, but is not limited to a notebook computer. In an embodiment, a system 600 includes, but is not limited to a personal digital assistant (PDA). In an embodiment, a system 600 includes, but is not limited to a server. In an embodiment, a system 600 includes, but is not limited to a workstation. In an embodiment, a system 600 includes, but is not limited to a cellular telephone. In an embodiment, a system 600 includes, but is not limited to a mobile computing device. In an embodiment, a system 600 includes, but is not limited to a smart phone. In an embodiment, a system 600 includes, but is not limited to an internet appliance. Other types of computing devices may be configured with the microelectronic device that includes pseudo-stripline in an integrated-circuit package substrate embodiments.

In an embodiment, the processor 610 has one or more processing cores 612 and 612N, where 612N represents the Nth processor core inside processor 610 where N is a positive integer. In an embodiment, the electronic device system 600 using a pseudo-stripline in an integrated-circuit package substrate embodiment that includes multiple processors including 610 and 605, where the processor 605 has logic similar or identical to the logic of the processor 610. In an embodiment, the processing core 612 includes, but is not limited to, pre-fetch logic to fetch instructions, decode logic to decode the instructions, execution logic to execute instructions and the like. In an embodiment, the processor 610 has a cache memory 616 to cache at least one of instructions and data for the pseudo-stripline in an integrated-circuit package substrate in the system 600. The cache memory 616 may be organized into a hierarchal structure including one or more levels of cache memory.

In an embodiment, the processor 610 includes a memory controller 614, which is operable to perform functions that enable the processor 610 to access and communicate with memory 630 that includes at least one of a volatile memory 632 and a non-volatile memory 634. In an embodiment, the processor 610 is coupled with memory 630 and chipset 620. In an embodiment, the chipset 620 is part of a system-in-package with a pseudo-stripline in an integrated-circuit package substrate depicted in FIGS. 1K, 2, 3 and 4. The processor 610 may also be coupled to a wireless antenna 678 to communicate with any device configured to at least one of transmit and receive wireless signals. In an embodiment, the wireless antenna interface 678 operates in accordance with, but is not limited to, the IEEE 802.11 standard and its related family, Home Plug AV (HPAV). Ultra Wide Band (UWB), Bluetooth, WiMax, or any form of wireless communication protocol.

In an embodiment, the volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 634 includes, but is not limited to, flash memory, phase change memory (PCM), read-only memory (ROM), electrically erasable programmable read-only memory (EEPROM), or any other type of non-volatile memory device.

The memory 630 stores information and instructions to be executed by the processor 610. In an embodiment, the memory 630 may also store temporary variables or other intermediate information while the processor 610 is executing instructions. In the illustrated embodiment, the chipset 620 connects with processor 610 via Point-to-Point (PtP or P-P) interfaces 617 and 622. Either of these PtP embodiments may be achieved using a pseudo-stripline in an integrated-circuit package substrate embodiment as set forth in this disclosure. The chipset 620 enables the processor 610 to connect to other elements in a pseudo-stripline in an integrated-circuit package substrate embodiment in a system 600. In an embodiment, interfaces 617 and 622 operate in accordance with a PtP communication protocol such as the Intel® QuickPath Interconnect (QPI) or the like. In other embodiments, a different interconnect may be used.

In an embodiment, the chipset 620 is operable to communicate with the processor 610, 605N, the display device 640, and other devices 672, 676, 674, 660, 662, 664, 666, 677, etc. The chipset 620 may also be coupled to a wireless antenna 678 to communicate with any device configured to at least do one of transmit and receive wireless signals.

The chipset 620 connects to the display device 640 via the interface 626. The display 640 may be, for example, a liquid crystal display (LCD), a plasma display, cathode ray tube (CRT) display, or any other form of visual display device. In an embodiment, the processor 610 and the chipset 620 are merged into a pseudo-stripline in an integrated-circuit package substrate in a computing system. Additionally, the chipset 620 connects to one or more buses 650 and 655 that interconnect various elements 674, 660, 662, 664, and 666. Buses 650 and 655 may be interconnected together via a bus bridge 672 such as at least one pseudo-stripline in an integrated-circuit package substrate package apparatus embodiment. In an embodiment, the chipset 620, via interface 624, couples with a non-volatile memory 660, a mass storage device(s) 662, a keyboard/mouse 664, a network interface 666, smart TV 676, and the consumer electronics 677, etc.

In an embodiment, the mass storage device 662 includes, but is not limited to, a solid state drive, a hard disk drive, a universal serial bus flash memory drive, or any other form of computer data storage medium. In one embodiment, the network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the embedded magnetic inductor and a pseudo-stripline in an integrated-circuit package substrate package in a computing system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into the processor core 612.

In an embodiment, a single processor 610 includes pseudo-stripline in an integrated-circuit package substrate embodiments with chiplets, such as one, all or more than the chiplets depicted in FIGS. 3 and 4 and optionally one, all or more than the chiplets, making up the single processor 610.

Where useful, the computing system 600 may have a broadcasting structure interface such as for affixing the apparatus to a cellular tower.

To illustrate the pseudo-stripline in an integrated-circuit package substrate embodiments and methods disclosed herein, a non-limiting list of examples is provided herein:

Example 1 is an integrated-circuit package substrate, comprising: a lower solder-resist layer on a top build-up layer, wherein the lower solder-resist layer contacts a stripline trace that is between the lower solder-resist layer and the top build-up layer; a lower shielding plane below the top build-up layer, wherein the lower shielding plane covers an X-Y form factor of the stripline trace; a conformal metallization film on the lower solder-resist layer, wherein the conformal metallization film forms an upper shielding plane that covers the X-Y form factor of the stripline trace; and an upper solder-resist layer that covers the conformal metallization film.

In Example 2, the subject matter of Example 1 optionally includes a landing-pad via that penetrates the top build-up layer; and wherein the lower solder-resist layer at least partially overlaps a landing-pad surface on the landing-pad via.

In Example 3, the subject matter of any one or more of Examples 1-2 optionally include a landing-pad via that penetrates the top build-up layer; wherein the lower solder-resist layer at least partially overlaps a landing-pad surface on the landing-pad via; and a surface finish on the landing-pad surface of the landing-pad via, wherein the surface finish contacts and terminates at the lower solder-resist layer.

In Example 4, the subject matter of any one or more of Examples 1-3 optionally include a plated metal layer on the conformal metallization film, wherein the upper solder-resist layer contacts the plated metal layer.

In Example 5, the subject matter of any one or more of Examples 1-4 optionally include a landing-pad via that penetrates the top build-up layer; and a surface finish on the landing-pad via, wherein the conformal metallization film forms an undercut below upper solder-resist layer, and wherein the upper solder-resist layer exposes the surface finish.

In Example 6, the subject matter of any one or more of Examples 1-5 optionally include a plated metal layer on the conformal metallization film, wherein the upper solder-resist layer contacts the plated metal layer; a landing-pad via that penetrates the top build-up layer; a surface finish on the landing-pad via, wherein the conformal metallization film and the plated metal layer form an undercut below upper solder-resist layer, and wherein the upper solder-resist layer exposes the surface finish.

In Example 7, the subject matter of any one or more of Examples 1-6 optionally include wherein the upper solder-resist layer is undercut by the conformal metallization film, between the upper solder-resist layer and the lower solder-resist layer.

In Example 8, the subject matter of any one or more of Examples 1-7 optionally include wherein the surface finish includes a nickel-palladium-gold alloy, and wherein the conformal metallization film is a copper material.

In Example 9, the subject matter of any one or more of Examples 1-8 optionally include wherein the stripline trace is coupled between two integrated-circuit devices.

In Example 10, the subject matter of any one or more of Examples 1-9 optionally include wherein the upper solder-resist layer includes an upper surface, further including an integrated-circuit die with a surface that contacts an electrical bump, and wherein the surface is below the upper surface of the upper solder-resist layer.

Example 11 is an integrated-circuit package, comprising: an integrated-circuit package substrate; a lower solder-resist layer on a top build-up layer of the integrated-circuit package substrate, wherein the lower solder-resist layer contacts a stripline trace that is between the lower solder-resist layer and the top build-up layer; a lower shielding plane below the top build-up layer, wherein the lower shielding plane covers an X-Y form factor of the stripline trace; a conformal metallization film on the lower solder-resist layer, wherein the conformal metallization film forms an upper shielding plane that covers the X-Y form factor of the stripline trace; an upper solder-resist layer that covers the conformal metallization film; a landing-pad via that penetrates the top build-up layer; a surface finish on the landing-pad via, wherein the conformal metallization film forms an undercut below upper solder-resist layer, and wherein the upper solder-resist layer exposes the surface finish; and an integrated-circuit die coupled to the landing-pad via by contact through an electrical bump that contacts the integrated-circuit die and the surface finish.

In Example 12, the subject matter of Example 11 optionally includes wherein the lower solder-resist layer at least partially overlaps a landing-pad surface on the landing-pad via.

In Example 13, the subject matter of any one or more of Examples 11-12 optionally include wherein integrated-circuit package substrate includes a die side and a land side, wherein the die side exposes the surface finish on the landing-pad via.

In Example 14, the subject matter of any one or more of Examples 11-13 optionally include wherein integrated-circuit package substrate includes a die side and a land side, wherein the die side exposes the surface finish on the landing-pad via, further including a board coupled to the land side.

In Example 15, the subject matter of any one or more of Examples 11-14 optionally include wherein integrated-circuit package substrate includes a die side and a land side, wherein the die side exposes the surface finish on the landing-pad via, wherein the integrated-circuit die is a first integrated-circuit die, further including: a subsequent integrated-circuit die on the die side; an erribedded die in the integrated-circuit package substrate, wherein embedded die is coupled to the first integrated-circuit die and the subsequent integrated-circuit die.

In Example 16, the subject matter of any one or more of Examples 11-15, optionally include wherein integrated-circuit package substrate includes a die side and a land side, wherein the die side exposes the surface finish on the landing-pad via, wherein the integrated-circuit die is a first integrated-circuit die, further including: a subsequent integrated-circuit die on the die side; an at least partially embedded die in the integrated-circuit package substrate, wherein at least partially embedded die is coupled to the first integrated-circuit die and the subsequent integrated-circuit die.

In Example 17, the subject matter of any one or more of Examples 11-16 optionally include wherein the stripline trace is coupled between two integrated-circuit devices, further including. wherein the integrated-circuit die is part of a chipset.

Example 18 is a method of forming an integrated-circuit package substrate, comprising: patterning a conformal metallization film over a lower solder-resist layer, wherein the lower solder-resist layer contacts a stripline trace upon a top build-up layer; patterning an upper solder-resist layer above the lower solder-resist layer to open a die-seat area and to remain over the stripline trace; opening a seat region through the upper solder-resist layer and the conformal metallization film, under conditions to form an undercut below the upper solder-resist layer, and under conditions to expose a surface finish on a landing-pad via.

In Example 19, the subject matter of Example 18 optionally includes forming a plated metallization layer on the conformal metallization film, and wherein opening the seat region through the upper solder-resist layer and the conformal metallization film, also occurs under conditions to form the undercut.

In Example 20, the subject matter of any one or more of Examples 18-19 optionally include connecting an integrated-circuit die at the seat region through an electrical bump.

In Example 21, the subject matter of any one or more of Examples 18-20 optionally include connecting an inte-grated-circuit die at the seat region through an electrical bump, wherein the top build-up layer is part of an integrated-circuit package substrate including a die side and a land side; and connecting the land side to a board.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), respect to other examples more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a. claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a. separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. An integrated-circuit package substrate, comprising:
   a lower solder-resist layer on a top build-up layer, wherein the lower solder-resist layer contacts a stripline trace that is between the lower solder-resist, layer and the top build-up layer;
   a lower shielding plane below the top build-up layer, wherein the lower shielding plane covers an X-Y form factor of the stripline trace;
   a conformal metallization film on the lower solder-resist layer, wherein the conformal metallization film forms an upper shielding plane that covers the X-Y form factor of the stripline trace; and
   an upper solder-resist layer that covers the conformal metallization film, wherein the upper solder-resist layer is undercut by the conformal metallization film, between the upper solder-resist layer and the lower solder-resist layer.

2. The integrated-circuit package substrate of claim 1, further including:
   a landing-pad via that penetrates the top build-up layer; and
   wherein the lower solder-resist layer at least partially overlaps a landing-pad surface on the landing-pad via.

3. The integrated-circuit package substrate of claim 1, further including:
   a landing-pad via that penetrates the top build-up layer;
   wherein the lower solder-resist layer at least partially overlaps a landing-pad surface on the landing-pad via; and
   a surface finish on the landing-pad surface of the landing-pad via, wherein the surface finish contacts and terminates at the lower solder-resist layer.

4. The integrated-circuit package substrate of claim 1, further including a plated metal layer on the conformal metallization film, wherein the upper solder-resist layer contacts the plated metal layer.

5. The integrated-circuit package substrate of claim 1, further including:
   a landing-pad via that penetrates the top build-up layer; and
   a surface finish on the landing-pad via, wherein the conformal metallization film forms an undercut below upper solder-resist layer, and wherein the upper solder-resist layer exposes the surface finish.

6. The integrated-circuit package substrate of claim 5, wherein the surface finish includes a nickel-palladium-gold alloy, and wherein the conformal metallization film is a copper material.

7. The integrated-circuit package substrate of claim 1, further including:
   a plated metal layer on the conformal metallization film, wherein the upper solder-resist layer contacts the plated metal layer;
   a landing-pad via that penetrates the top build-up layer;
   a surface finish on the landing-pad via, wherein the conformal metallization film and the plated metal layer form an undercut below upper solder-resist, layer, and wherein the upper solder-resist layer exposes the surface finish.

8. The integrated-circuit package substrate of claim 1, wherein the stripline trace is coupled between two integrated-circuit devices.

9. The integrated-circuit package substrate of claim 1, wherein the upper solder-resist layer includes an upper surface, further including an integrated-circuit die with a surface that contacts an electrical bump, and wherein the surface is below the upper surface of the upper solder-resist layer.

10. An integrated-circuit package, comprising:
    an integrated-circuit package substrate;
    a lower solder-resist layer on a top build-up layer of the integrated-circuit package substrate, wherein the lower solder-resist layer contacts a stripline trace that is between the lower solder-resist layer and the top build-up layer;
    a lower shielding plane below the top build-up layer, wherein the lower shielding plane covers an X-Y form factor of the stripline trace;
    a conformal metallization film on the lower solder-resist layer, wherein the conformal metallization film forms an upper shielding plane that covers the X-Y form factor of the stripline trace;
    an upper solder-resist layer that covers the conformal metallization film;
    a landing-pad via that penetrates the top build-up layer;
    a surface finish on the landing-pad via, wherein the conformal metallization film forms an undercut below upper solder-resist layer, and wherein the upper solder-resist layer exposes the surface finish; and
    an integrated-circuit die coupled to the landing-pad via by contact through an electrical bump that contacts the integrated-circuit die and the surface finish.

11. The integrated-circuit package of claim 10, further including:
    wherein the lower solder-resist layer at least partially overlaps a landing-pad surface on the landing-pad via.

12. The integrated-circuit package of claim 10, wherein integrated-circuit package substrate includes a die side and a land side, wherein the die side exposes the surface finish on the landing-pad via.

13. The integrated-circuit package of claim 10, wherein integrated-circuit package substrate includes a die side and a land side, wherein the die side exposes the surface finish on the landing-pad via, further including a board coupled to the land side.

14. The integrated-circuit package of claim 10, wherein integrated-circuit package substrate includes a die side and a land side, wherein the die side exposes the surface finish on the landing-pad via, wherein the integrated-circuit die is a first integrated-circuit die, further including:
    a subsequent, integrated-circuit die on the die side;
    an embedded die in the integrated-circuit package substrate, wherein embedded die is coupledto the first integrated-circuit die and the subsequent integrated-circuit die.

15. The integrated-circuit package of claim 10, wherein integrated-circuit package substrate includes a die side and a land side, wherein the die side exposes the surface finish on the landing-pad via, wherein the integrated-circuit die is a first integrated-circuit die, further including:
- a subsequent integrated-circuit die on the die side;
- an at least partially embedded die in the integrated-circuit package substrate, wherein at least partially embedded die is coupled to the first integrated-circuit die and the subsequent integrated-circuit die.

16. The integrated-circuit package of claim 10, wherein the stripline trace is coupled between two integrated-circuit devices, further including, wherein the integrated-circuit die is part of a chipset.

* * * * *